US008492883B2

(12) United States Patent
Chien et al.

(10) Patent No.: US 8,492,883 B2
(45) Date of Patent: Jul. 23, 2013

(54) SEMICONDUCTOR PACKAGE HAVING A CAVITY STRUCTURE

(75) Inventors: Pao-Huei Chang Chien, Fengshan (TW); Ping-Cheng Hu, Kaohsiung (TW); Chien-Wen Chen, Kaohsiung (TW); Hsu-Yang Lee, Tainan (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 775 days.

(21) Appl. No.: 12/192,702

(22) Filed: Aug. 15, 2008

(65) Prior Publication Data
US 2009/0230523 A1 Sep. 17, 2009

Related U.S. Application Data

(60) Provisional application No. 61/036,470, filed on Mar. 14, 2008.

(51) Int. Cl.
*H01L 23/495* (2006.01)

(52) U.S. Cl.
USPC ............ 257/676; 257/E23.037; 257/E21.506; 257/E21.51; 257/E23.18

(58) Field of Classification Search
USPC ........... 438/123; 257/676, E23.037, E21.506, 257/666, E21.51, 670, 622, 787, E23.001, 257/E23.18, 618, 625, 705, 707, 712–722
See application file for complete search history.

(56) References Cited

U.S. PATENT DOCUMENTS

| 5,200,025 | A | * | 4/1993 | Toei et al. ........................ 216/12 |
| 5,389,739 | A | * | 2/1995 | Mills ............................ 174/540 |
| 5,656,550 | A |   | 8/1997 | Tsuji et al. |
| 5,800,958 | A | * | 9/1998 | Manteghi ....................... 438/123 |

(Continued)

FOREIGN PATENT DOCUMENTS

| CN | 2726111 | 9/2005 |
| CN | 1726591 | 1/2006 |

(Continued)

OTHER PUBLICATIONS

Chen et al., U.S. Appl. No. 12/192,805, filed Aug. 15, 2008 for "Advanced Quad Flat No Lead Chip Package Having a Protective Layer to Enhance Surface Mounting and Manufacturing Methods Thereof." Office Action mailed May 27, 2010; Notice of Allowance mailed Oct. 29, 2010.

(Continued)

*Primary Examiner* — N Drew Richards
*Assistant Examiner* — Ankush Singal
(74) *Attorney, Agent, or Firm* — Foley & Lardner LLP

(57) ABSTRACT

A semiconductor package and related methods are described. In one embodiment, the package includes a die pad, a plurality of leads, a chip, and a package body. The die pad includes: (1) a peripheral edge region defining, a cavity with a cavity bottom including a central portion; (2) an upper sloped portion; and (3) a lower sloped portion. Each lead includes an upper sloped portion and a lower sloped portion. The chip is disposed on the central portion of the cavity bottom and is coupled to the leads. The package body is formed over the chip and the leads, substantially fills the cavity, and substantially covers the upper sloped portions of the die pad and the leads. The lower sloped portions of the die pad and the leads at least partially extend outwardly from a lower surface of the package body.

37 Claims, 10 Drawing Sheets

U.S. PATENT DOCUMENTS

| | | | |
|---|---|---|---|
| 5,804,468 A | 9/1998 | Tsuji et al. | |
| 5,847,458 A * | 12/1998 | Nakamura et al. | 257/738 |
| 5,900,676 A | 5/1999 | Kweon et al. | |
| 5,969,412 A * | 10/1999 | Matsutomo | 257/670 |
| 6,001,671 A | 12/1999 | Fjelstad | |
| 6,025,650 A * | 2/2000 | Tsuji et al. | 257/786 |
| 6,093,584 A | 7/2000 | Fjelstad | |
| 6,097,098 A | 8/2000 | Ball | |
| 6,132,593 A | 10/2000 | Tan | |
| 6,191,494 B1 | 2/2001 | Ooyama et al. | |
| 6,201,292 B1 * | 3/2001 | Yagi et al. | 257/666 |
| 6,229,205 B1 * | 5/2001 | Jeong et al. | 257/676 |
| 6,238,952 B1 | 5/2001 | Lin | |
| 6,242,284 B1 | 6/2001 | Kang et al. | |
| 6,261,864 B1 | 7/2001 | Jung et al. | |
| 6,291,271 B1 | 9/2001 | Lee et al. | |
| 6,303,985 B1 * | 10/2001 | Larson et al. | 257/676 |
| 6,306,685 B1 | 10/2001 | Liu et al. | |
| 6,333,252 B1 | 12/2001 | Jung et al. | |
| 6,342,730 B1 * | 1/2002 | Jung et al. | 257/692 |
| 6,358,778 B1 | 3/2002 | Shinohara | |
| 6,379,996 B1 * | 4/2002 | Suzuki | 438/106 |
| 6,395,582 B1 * | 5/2002 | Sohn et al. | 438/111 |
| 6,410,987 B1 | 6/2002 | Kanemoto et al. | |
| 6,424,047 B1 * | 7/2002 | Chua et al. | 257/773 |
| 6,429,536 B1 | 8/2002 | Liu et al. | |
| 6,451,627 B1 * | 9/2002 | Coffman | 438/111 |
| 6,495,909 B2 | 12/2002 | Jung et al. | |
| 6,498,099 B1 * | 12/2002 | McLellan et al. | 438/689 |
| 6,501,162 B2 | 12/2002 | Sakamoto et al. | |
| 6,525,406 B1 | 2/2003 | Chung et al. | |
| 6,528,877 B2 * | 3/2003 | Ernst et al. | 257/707 |
| 6,528,879 B2 | 3/2003 | Sakamoto et al. | |
| 6,528,893 B2 | 3/2003 | Jung et al. | |
| 6,545,347 B2 | 4/2003 | McClellan | |
| 6,548,328 B1 * | 4/2003 | Sakamoto et al. | 438/121 |
| 6,551,859 B1 | 4/2003 | Lee et al. | |
| 6,562,660 B1 * | 5/2003 | Sakamoto et al. | 438/124 |
| 6,580,159 B1 | 6/2003 | Rodriguez et al. | |
| 6,585,905 B1 | 7/2003 | Fan et al. | |
| 6,586,677 B2 * | 7/2003 | Glenn | 174/528 |
| 6,635,956 B2 | 10/2003 | Sakamoto et al. | |
| 6,635,957 B2 | 10/2003 | Kwan et al. | |
| 6,650,020 B2 | 11/2003 | Yamada et al. | |
| 6,683,368 B1 | 1/2004 | Mostafazadeh | |
| 6,689,640 B1 | 2/2004 | Mostafazadeh | |
| 6,700,188 B2 | 3/2004 | Lin | |
| 6,706,547 B2 | 3/2004 | Sakamoto et al. | |
| 6,713,849 B2 * | 3/2004 | Hasebe et al. | 257/667 |
| 6,740,961 B1 | 5/2004 | Mostafazadeh | |
| 6,759,271 B2 * | 7/2004 | Miyazaki | 438/108 |
| 6,762,118 B2 | 7/2004 | Liu et al. | |
| 6,777,788 B1 * | 8/2004 | Wan et al. | 257/670 |
| 6,777,789 B1 * | 8/2004 | Glenn et al. | 257/676 |
| 6,812,063 B2 | 11/2004 | Huang | |
| 6,812,410 B2 | 11/2004 | Sakamoto et al. | |
| 6,812,552 B2 | 11/2004 | Islam et al. | |
| 6,818,973 B1 | 11/2004 | Foster | |
| 6,846,704 B2 * | 1/2005 | Paek | 438/123 |
| 6,861,295 B2 * | 3/2005 | Jung et al. | 438/124 |
| 6,861,734 B2 | 3/2005 | Minamio et al. | |
| 6,906,414 B2 * | 6/2005 | Zhao et al. | 257/707 |
| 6,927,483 B1 | 8/2005 | Lee et al. | |
| 6,933,594 B2 | 8/2005 | McLellan et al. | |
| 6,946,324 B1 * | 9/2005 | McLellan et al. | 438/111 |
| 6,949,816 B2 * | 9/2005 | Brown et al. | 257/684 |
| 6,975,022 B2 | 12/2005 | Sakamoto et al. | |
| 6,975,038 B1 | 12/2005 | Mostafazadeh | |
| 6,984,880 B2 * | 1/2006 | Minamio et al. | 257/676 |
| 6,995,459 B2 | 2/2006 | Lee et al. | |
| 6,995,460 B1 | 2/2006 | McLellan et al. | |
| 7,009,286 B1 | 3/2006 | Kirloskar et al. | |
| 7,026,190 B2 | 4/2006 | Kobayashi et al. | |
| 7,049,177 B1 | 5/2006 | Fan et al. | |
| 7,060,535 B1 * | 6/2006 | Sirinorakul et al. | 438/123 |
| 7,087,461 B2 | 8/2006 | Park et al. | |
| 7,087,462 B1 | 8/2006 | Park et al. | |
| 7,091,606 B2 | 8/2006 | Sakamoto et al. | |
| 7,095,100 B2 | 8/2006 | Kasuya | |
| 7,125,798 B2 | 10/2006 | Sakamoto et al. | |
| 7,129,116 B2 | 10/2006 | Islam et al. | |
| 7,145,222 B2 | 12/2006 | Gai | |
| 7,166,495 B2 | 1/2007 | Ball | |
| 7,173,336 B2 | 2/2007 | Sakamoto et al. | |
| 7,193,302 B2 | 3/2007 | Tseng | |
| 7,196,416 B2 | 3/2007 | Hochstenbach et al. | |
| 7,208,826 B2 | 4/2007 | Sakamoto et al. | |
| 7,215,009 B1 | 5/2007 | Leng et al. | |
| 7,226,811 B1 | 6/2007 | McLellan et al. | |
| 7,235,888 B2 | 6/2007 | Hosokawa et al. | |
| 7,247,526 B1 * | 7/2007 | Fan et al. | 438/123 |
| 7,247,938 B2 | 7/2007 | Groenhuis et al. | |
| 7,262,491 B2 * | 8/2007 | Islam et al. | 257/670 |
| 7,271,032 B1 | 9/2007 | McLellan et al. | |
| 7,301,225 B2 * | 11/2007 | Wong et al. | 257/666 |
| 7,319,266 B2 * | 1/2008 | St. Germain et al. | 257/676 |
| 7,344,920 B1 | 3/2008 | Kirloskar et al. | |
| 7,348,663 B1 * | 3/2008 | Kirloskar et al. | 257/704 |
| 7,351,612 B2 * | 4/2008 | Gai | 438/117 |
| 7,382,044 B1 | 6/2008 | Yilmaz et al. | |
| 7,407,834 B2 | 8/2008 | Shimanuki et al. | |
| 7,410,834 B2 * | 8/2008 | Fukaya et al. | 438/123 |
| 7,443,012 B2 | 10/2008 | Yamaguchi | |
| 7,446,397 B2 * | 11/2008 | Gai | 257/667 |
| 7,459,347 B2 | 12/2008 | Shimanuki et al. | |
| 7,494,557 B1 | 2/2009 | Peterson | |
| 7,518,156 B2 * | 4/2009 | Hasebe et al. | 257/98 |
| 7,545,026 B2 | 6/2009 | Six | |
| 7,550,322 B2 * | 6/2009 | Kimura | 438/126 |
| 7,563,648 B2 | 7/2009 | Islam et al. | |
| 7,598,606 B2 | 10/2009 | Chow et al. | |
| 7,608,482 B1 * | 10/2009 | Bayan | 438/112 |
| 7,622,332 B2 | 11/2009 | Islam et al. | |
| 7,679,172 B2 * | 3/2010 | Huang et al. | 257/678 |
| 7,683,461 B2 | 3/2010 | Lau | |
| 7,786,557 B2 | 8/2010 | Hsieh et al. | |
| 7,790,500 B2 * | 9/2010 | Ramos et al. | 438/106 |
| 7,799,611 B2 * | 9/2010 | Ramos et al. | 438/112 |
| 7,834,431 B2 * | 11/2010 | Hooper et al. | 257/667 |
| 7,834,469 B2 | 11/2010 | Chuang et al. | |
| 7,838,974 B2 * | 11/2010 | Poddar et al. | 257/676 |
| 7,846,775 B1 * | 12/2010 | Lee et al. | 438/112 |
| 8,237,250 B2 * | 8/2012 | Chang Chien et al. | 257/676 |
| 2001/0052600 A1 * | 12/2001 | Sakamoto et al. | 257/79 |
| 2002/0084518 A1 * | 7/2002 | Hasebe et al. | 257/676 |
| 2002/0096790 A1 | 7/2002 | Kasuya | |
| 2002/0109214 A1 | 8/2002 | Minamio et al. | |
| 2002/0160552 A1 * | 10/2002 | Minamio et al. | 438/108 |
| 2002/0163015 A1 * | 11/2002 | Lee et al. | 257/200 |
| 2003/0071333 A1 * | 4/2003 | Matsuzawa | 257/676 |
| 2003/0092205 A1 * | 5/2003 | Wu et al. | 438/15 |
| 2003/0127711 A1 | 7/2003 | Kawai et al. | |
| 2003/0170922 A1 * | 9/2003 | Sakamoto et al. | 438/22 |
| 2003/0203539 A1 | 10/2003 | Islam et al. | |
| 2004/0046237 A1 * | 3/2004 | Abe et al. | 257/676 |
| 2004/0094829 A1 * | 5/2004 | Minamio et al. | 257/676 |
| 2004/0124505 A1 * | 7/2004 | Mahle et al. | 257/666 |
| 2004/0217450 A1 * | 11/2004 | Li et al. | 257/666 |
| 2004/0262718 A1 * | 12/2004 | Ramakrishna | 257/666 |
| 2005/0006737 A1 | 1/2005 | Islam et al. | |
| 2005/0023667 A1 | 2/2005 | Lin et al. | |
| 2005/0133892 A1 | 6/2005 | Fujimoto et al. | |
| 2005/0146058 A1 | 7/2005 | Danno | |
| 2006/0033184 A1 | 2/2006 | Park et al. | |
| 2006/0055009 A1 * | 3/2006 | Shim et al. | 257/666 |
| 2006/0240600 A1 | 10/2006 | Ito et al. | |
| 2007/0018291 A1 | 1/2007 | Huang et al. | |
| 2007/0052070 A1 | 3/2007 | Islam et al. | |
| 2007/0052076 A1 * | 3/2007 | Ramos et al. | 257/676 |
| 2007/0059863 A1 | 3/2007 | Li et al. | |
| 2007/0075404 A1 * | 4/2007 | Dimaano et al. | 257/666 |
| 2007/0085199 A1 | 4/2007 | Ong et al. | |
| 2007/0126094 A1 | 6/2007 | Shojaie et al. | |
| 2007/0141756 A1 | 6/2007 | Iitani et al. | |
| 2007/0164403 A1 | 7/2007 | Huang et al. | |
| 2007/0164411 A1 | 7/2007 | Huang et al. | |
| 2007/0181983 A1 | 8/2007 | Takai et al. | |

| | | | |
|---|---|---|---|
| 2007/0194417 | A1 | 8/2007 | Yoshida et al. |
| 2007/0200206 | A1* | 8/2007 | Wong et al. .................... 257/666 |
| 2007/0222040 | A1 | 9/2007 | Lin |
| 2008/0029855 | A1* | 2/2008 | Chang ........................... 257/666 |
| 2008/0029856 | A1* | 2/2008 | Chou et al. .................... 257/666 |
| 2008/0061414 | A1 | 3/2008 | Retuta et al. |
| 2008/0067649 | A1 | 3/2008 | Matsunaga et al. |
| 2008/0079124 | A1 | 4/2008 | Haga et al. |
| 2008/0079127 | A1* | 4/2008 | Gerber ........................... 257/676 |
| 2008/0093715 | A1* | 4/2008 | Lange et al. .................. 257/667 |
| 2008/0102563 | A1 | 5/2008 | Lange et al. |
| 2008/0179758 | A1 | 7/2008 | Wong et al. |
| 2008/0191325 | A1* | 8/2008 | Shirasaka ..................... 257/666 |
| 2008/0258278 | A1* | 10/2008 | Ramos et al. ................. 257/676 |
| 2008/0258279 | A1* | 10/2008 | Lin et al. ....................... 257/676 |
| 2008/0311705 | A1 | 12/2008 | Kim |
| 2009/0001540 | A1* | 1/2009 | Yang et al. .................... 257/686 |
| 2009/0065914 | A1* | 3/2009 | Engl et al. ..................... 257/676 |
| 2009/0127682 | A1 | 5/2009 | Kim et al. |
| 2009/0152691 | A1 | 6/2009 | Nguyen et al. |
| 2009/0189260 | A1 | 7/2009 | Hasebe et al. |
| 2009/0189261 | A1 | 7/2009 | Lim et al. |
| 2009/0230523 | A1 | 9/2009 | Chien et al. |
| 2009/0230524 | A1 | 9/2009 | Chien et al. |
| 2009/0230525 | A1* | 9/2009 | Chang Chien et al. ....... 257/676 |
| 2009/0230526 | A1 | 9/2009 | Chen et al. |
| 2009/0267210 | A1 | 10/2009 | Chuang |
| 2009/0278243 | A1 | 11/2009 | Chuang |
| 2009/0283882 | A1 | 11/2009 | Hsieh et al. |
| 2009/0315159 | A1 | 12/2009 | Abbott |
| 2010/0044843 | A1 | 2/2010 | Chang Chien et al. |
| 2010/0044850 | A1* | 2/2010 | Lin et al. ....................... 257/690 |
| 2010/0258920 | A1 | 10/2010 | Chien et al. |
| 2010/0258921 | A1 | 10/2010 | Chang Chien et al. |
| 2010/0258934 | A1 | 10/2010 | Chang Chien et al. |
| 2011/0163430 | A1 | 7/2011 | Lee et al. |

FOREIGN PATENT DOCUMENTS

| | | |
|---|---|---|
| CN | 1735963 | 2/2006 |
| CN | 1985371 | 6/2007 |
| CN | 101442035 | 5/2009 |
| CN | 101540309 | 9/2009 |
| CN | 101540310 | 9/2009 |
| CN | 101587868 | 11/2009 |
| CN | 101252096 | 8/2010 |
| CN | 101273452 | 11/2010 |
| JP | 05166985 | 7/1993 |
| JP | 11195733 | 7/1999 |
| JP | 2001024135 | 1/2001 |
| JP | 2005317998 | 11/2005 |

OTHER PUBLICATIONS

Lee et al., U.S. Appl. No. 12/683,426, filed Jan. 6, 2010 for "Leadframe Structure, Advanced Quad Flat No Lead Package Structure Using the Same and Manufacturing Methods Thereof."

Chuang, et al., U.S. Appl. No. 12/428,762, filed Apr. 23, 2009 for "Integrated Circuit Package Having a Stacked Die Structure and Manufacturing Method Thereof." Office Actions mailed Jun. 24, 2010, Dec. 8, 2010.

Chien, et al., U.S. Appl. No. 12/192,742, filed Aug. 15, 2008 for "Semiconductor Chip Package Having Ground and Power Regions and Manufacturing Methods Thereof." Office Action mailed Feb. 8, 2011.

Chien et al., U.S. Appl. No. 12/192,761, filed Aug. 15, 2008 for "Advanced Quad Flat No Lead Chip Package Having Marking and Corner Lead Features and Manufacturing Methods Thereof." Office Action mailed Apr. 7, 2011.

Lin et al., U.S. Appl. No. 12/405,043, filed Mar. 16, 2009 for "Advanced Quad Flat Non-Leaded Package Structure and Manufacturing Method Thereof." Office Actions mailed Aug. 5, 2010, Jan. 7, 2011; Advisory Action mailed Mar. 22, 2011.

Chien, et al., U.S. Appl. No. 12/425,635, filed Apr. 17, 2009 for "Advanced Quad Flat Non-Leaded Package Structure and Manufacturing Method Thereof." Office Action mailed Feb. 18, 2011.

Chien et al. U.S. Appl. No. 12/547,787, filed Aug. 26, 2009 for "Manufacturing Method of Advanced Quad Flat Non-Leaded Package". Office Action mailed Jun. 7, 2011.

Chien et al. U.S. Appl. No. 12/550,645, filed Aug. 31, 2009 for "Advanced Quad Flat Non-Leaded Package Structure and Manufacturing Method Thereof". Office Action mailed Apr. 6, 2011.

Chien, et al., U.S. Appl. No. 12/192,742, filed Aug. 15, 2008 for "Semiconductor Chip Package Having Ground and Power Regions and Manufacturing Methods Thereof." Office Action mailed Sep. 7, 2011; Interview Summary mailed Nov. 23, 2011.

Chien, et al., U.S. Appl. No. 12/192,761, filed Aug. 15, 2008 for "Advanced Quad Flat No Lead Chip Package Having Marking and Corner Lead Features and Manufacturing Methods Thereof." Notice of Allowance mailed Oct. 13, 2011.

Chien, et al., U.S. Appl. No. 12/425,635, filed Apr. 17, 2009 for "Advanced Quad Flat Non-Leaded Package Structure and Manufacturing Method Thereof." Office Actions mailed Aug. 4, 2011; Oct. 27, 2011.

Chien et al., U.S. Appl. No. 12/547,787, filed Aug. 26, 2009 for "Manufacturing Method of Advanced Quad Flat Non-Leaded Package." Notice of Allowance mailed Nov. 4, 2011.

Chien et al. U.S. Appl. No. 12/550,645, filed Aug. 31, 2009 for "Advanced Quad Flat Non-Leaded Package Structure and Manufacturing Method Thereof". Notice of Allowance mailed Sep. 22, 2011.

Chuang, et al., U.S. Appl. No. 12/428,762, filed Apr. 23, 2009 for "Integrated Circuit Package Having a Stacked Die Structure and Manufacturing Method Thereof." Advisory Action mailed Feb. 18, 2011.

Chien et al. U.S. Appl. No. 12/550,655, filed Aug. 31, 2009 for "Advanced Quad Flat-Leaded Package Structure and Manufacturing Method Thereof". Office Action mailed Dec. 7, 2011.

* cited by examiner

SEMICONDUCTOR PACKAGE HAVING A CAVITY STRUCTURE

CROSS-REFERENCE TO RELATED APPLICATION

The present application claims the benefit of the following commonly owned U.S. provisional patent application, which is incorporated herein by reference in its entirety: U.S. Provisional Patent Application No. 61/036,470, entitled "Chip Package Structure and Manufacturing Methods Thereof," filed on Mar. 14, 2008.

FIELD OF THE INVENTION

The present invention relates generally to semiconductor chip packages. More particularly, this invention relates to an advanced Quad Flat No Lead (aQFN) chip package having a cavity structure and manufacturing methods thereof.

BACKGROUND OF THE INVENTION

Semiconductor chips have become progressively more complex, driven in large part by the need for increasing processing power in a smaller chip size. In response, packaging technologies have evolved, for example, to enable an increased lead density, which can reduce the footprint area of a package mounted on a printed circuit board (PCB). Some packaging technologies, such as Quad Flat No Lead (QFN), may enable this increased lead density by providing inner and outer rows of leads connected to a disposable portion of a leadframe. However, manufacturing processes for such leadframes may not be scalable beyond two rows of leads. As lead density requirements further increase, it may be desirable to use packaging technologies that are more scalable in terms of lead density.

Moreover, it may be desirable to further reduce package size in additional ways, such as by reducing package height. At the same time, it may be desirable to maintain sufficient mold locking of leads to a package body, and to facilitate surface mounting of the package to a PCB. It may also be desirable to formulate a packaging process designed to meet these objectives. Current packaging solutions can meet some of these objectives but may not be able to meet most, or all, of these objectives.

It is against this background that a need arose to develop the chip package and associated manufacturing methods described herein.

SUMMARY OF THE INVENTION

In one innovative aspect, the invention relates to a semiconductor package. In one embodiment, the semiconductor package includes a die pad, a plurality of leads, a semiconductor chip, and a package body. The die pad includes: (1) a peripheral edge region including an upper surface and defining a cavity with a cavity bottom, where the cavity bottom includes a central portion; (2) an upper sloped portion disposed adjacent to the upper surface of the peripheral edge region and facing away from the cavity; and (3) a lower sloped portion disposed adjacent to the upper sloped portion and facing away from the cavity. The plurality of leads is disposed around the die pad, and each of the plurality of leads includes: (1) an upper surface; (2) a lower surface; (3) an upper sloped portion disposed adjacent to the upper surface of the each of the plurality of leads; and (4) a lower sloped portion disposed adjacent to the lower surface of the each of the plurality of leads. The semiconductor chip is disposed on the central portion of the cavity bottom and is electrically coupled to the plurality of leads. The package body is formed over the semiconductor chip and the plurality of leads so that the package body substantially fills the cavity and substantially covers the upper sloped portions of the die pad and the plurality of leads. The package body is also formed over the semiconductor chip and the plurality of leads so that the lower sloped portions of the die pad and the plurality of leads at least partially extend outwardly from a lower surface of the package body.

In another innovative aspect, the invention relates to a method of making a semiconductor package. In one embodiment, the method includes providing a metal carrier plate including (1) a base including an upper surface and a lower surface; (2) a central protrusion having an upper surface, extending upwardly from the base, and defining a central region of the upper surface of the base, the central region having a central portion; (3) a plurality of peripheral protrusions, each having an upper surface, extending upwardly from the base, and being disposed around the central protrusion; (4) a first metal coating formed on the upper surfaces of the central protrusion and the plurality of peripheral protrusions; and (5) a second metal coating formed on the lower surface of the metal carrier plate below the central region, the central protrusion, and the plurality of peripheral protrusions. The method further includes attaching a semiconductor chip to the central portion, electrically coupling the semiconductor chip to at least a first protrusion included in the plurality of peripheral protrusions, and forming a package body over the semiconductor chip and the plurality of peripheral protrusions. The method further includes etching areas on the lower surface of the metal carrier plate without the second metal coating formed thereon such that: (1) the plurality of peripheral protrusions and the central protrusion are separated from one another so as to form a plurality of leads and a die pads where the die pad includes the central protrusion and the central region; (2) each of the plurality of leads includes a lower sloped portion disposed adjacent to a lower surface of the each of the plurality of leads; (3) the die pad includes a lower sloped portion disposed adjacent to a lower surface of the die pad; and (4) the lower sloped portions of the die pad and the plurality of leads at least partially extend outwardly from a lower surface of the package body.

In a further innovative aspect, the invention relates to a semiconductor package. In one embodiment, the semiconductor package includes a die pad, a plurality of leads, a semiconductor chip, and a package body. The die pad includes: (1) a base including an upper surface and a lower surface; (2) a protrusion extending upwardly from the base and disposed adjacent to a peripheral edge of the base, where the protrusion includes an upper surface; and (3) a first side surface extending between the upper surface of the protrusion and the lower surface of the base, where the first side surface includes a first peak that is disposed closer to the lower surface of the base than to the upper surface of the protrusion. The plurality of leads is disposed around the die pad, and at least one of the plurality of leads includes a second side surface including a second peak. The semiconductor chip is disposed on the upper surface of the base and is electrically coupled to the plurality of leads. The package body is formed over the semiconductor chip and the plurality of leads so that the package body substantially covers the upper surface of the base, at least a portion of the first side surface above the first peak, and at least a portion of the second side surface above the second peak. The package body is also formed over the semiconductor chip and the plurality of leads so that at least a portion of the first side surface below the first peak and at least a portion of the second side surface below the second peak protrude from a lower surface of the package body.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings, in which.

DETAILED DESCRIPTION OF THE INVENTION

Figure 1:
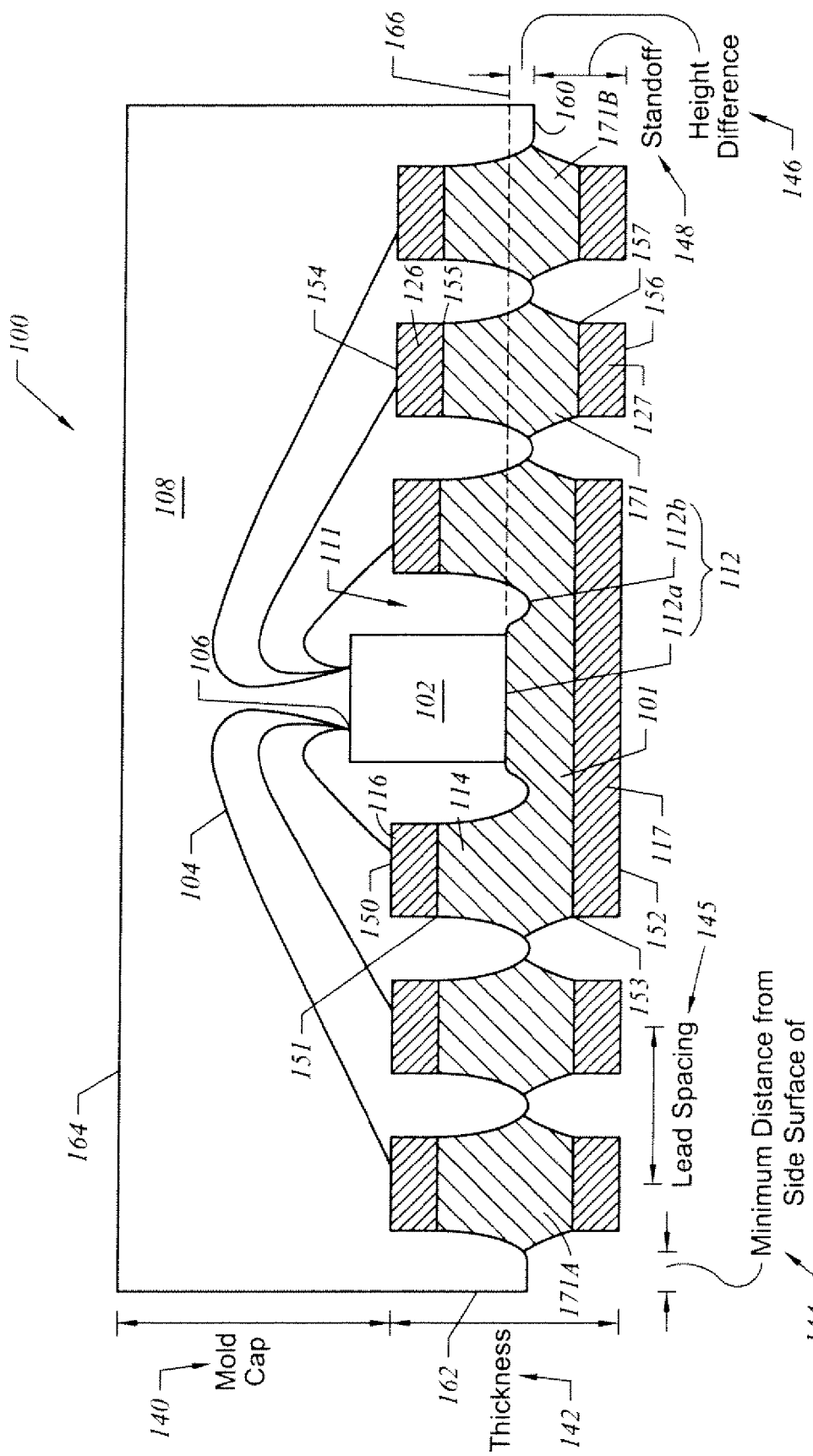
FIG. 1 illustrates a cross-sectional view of a semiconductor package, in accordance with one embodiment of the present invention.

FIG. 1 illustrates a cross-sectional view of a semiconductor package 100, in accordance with one embodiment of the present invention. The package 100 includes a die pad 101 with a peripheral edge region 114 that defines a cavity 111 with a cavity bottom 112. The peripheral edge region 114 may completely surround the cavity 111, but also can partially surround the cavity 111 for certain implementations. The cavity bottom 112 includes a central portion 112a. The cavity bottom 112 may also include a recess 112b around the central portion 112a. The central portion 112a may be approximately centrally located within the cavity bottom 112, but need not be if, for example, the recess 112b is of non-uniform width. The recess 112b may completely surround the central portion 112a, but also can partially surround the central portion 112a for certain implementations. A chip 102 is attached to the cavity bottom 112 by an adhesive layer (not shown). The adhesive layer may be a conductive or a non-conductive adhesive material, such as non-conductive epoxy. In the illustrated embodiment, the chip 102 is attached to the central portion 112a. Bonding pads 106 on the active surface of the chip 102 are electrically coupled to leads 171 through bonding wires 104, and may also be electrically coupled to at least part of the peripheral edge region 114 through bonding wires 104. The leads 171 are disposed around the die pad 102, and may completely or partially surround the die pad 101.

Figure 2:
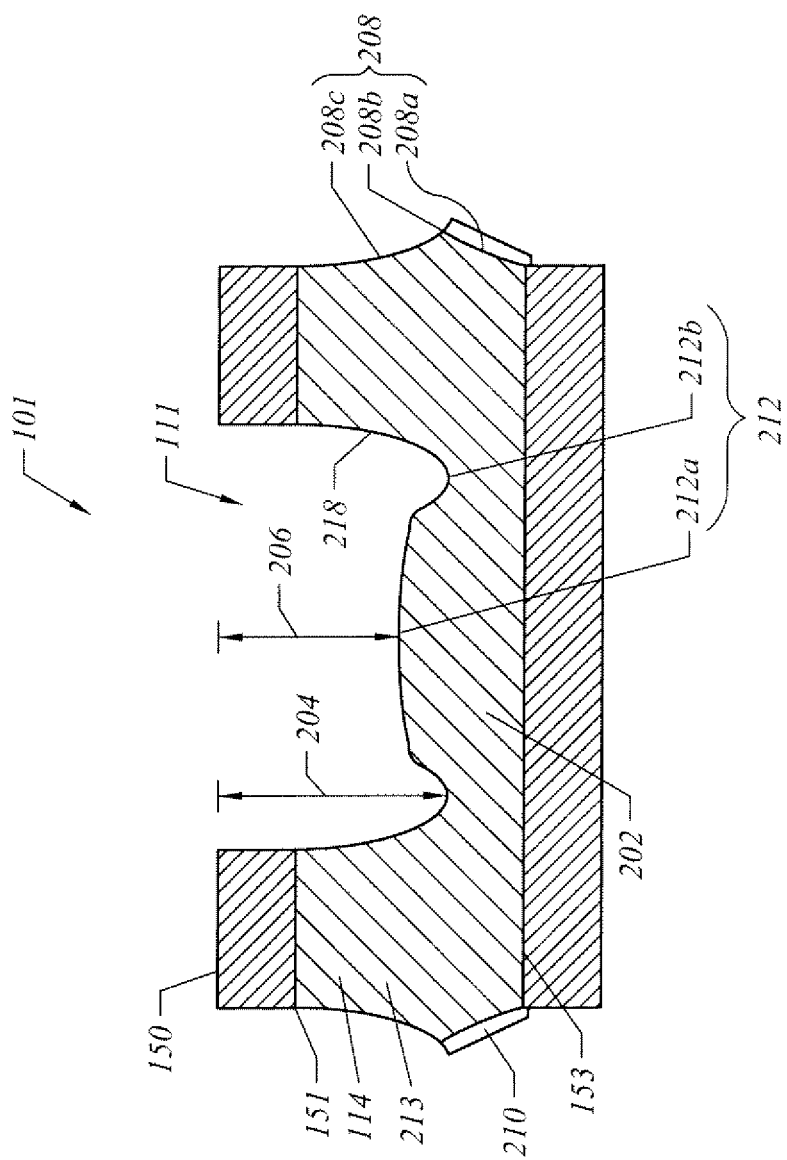
FIG. 2 illustrates a cross-sectional, enlarged view of a die pad, in accordance with one embodiment of the present invention.

FIG. 2 illustrates a cross-sectional, enlarged view of the die pad 101, in accordance with one embodiment of the present invention. The die pad 101 includes a side surface 208, which may completely or partially extend around a circumference of the die pad 101. In the illustrated embodiment, the side surface 208 includes an upper sloped portion 208c disposed adjacent to an upper surface 151 of the peripheral edge region 114 and facing away from the cavity 111. The side surface 208 also includes a lower sloped portion 208a disposed adjacent to the upper sloped portion 208c and facing away from the cavity 111. The peripheral edge region 114 also includes an upper sloped portion 218 disposed adjacent to the upper surface 151 and facing toward the cavity 111. Sloped portions 208a, 208c, and 218 may be linear or curved, and are typically non-perpendicular to the upper surface 151 of the peripheral edge region 114. The side surface 208 also includes a peak 208b.

Figure 3:
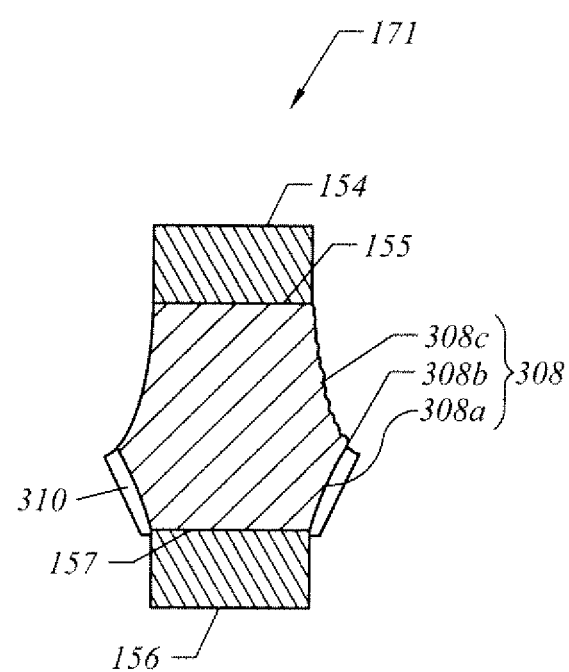
FIG. 3 illustrates a cross-sectional, enlarged view of a lead, in accordance with one embodiment of the present invention.

FIG. 3 illustrates a cross-sectional, enlarged view of a lead 171, in accordance with one embodiment of the present invention. The lead 171 includes a side surface 308, which may completely or partially extend around a circumference of the lead 171. In the illustrated embodiment, the side surface 308 includes an upper sloped portion 308e disposed adjacent to an upper surface 155 of the lead 171. The side surface 308 also includes a lower sloped portion 308a disposed adjacent to a lower surface 157 of the lead 171. Sloped portions 308a and 308c may be linear or curved, and are typically non-perpendicular to the upper surface 155 and the lower surface 157 of the lead 171. The side surface 308 also includes a peak 308b.

Referring back to FIG. 1 along with FIG. 2 and FIG. 3, a package body 108 is formed over the chip 102, the die pad 101, and the leads 171 so that the package body 108 substantially fills the cavity 111 and substantially covers the upper sloped portions 218 of the peripheral edge region 114. The package body 108 also substantially covers the upper sloped portions 208c of the die pad 101, and the upper sloped portions 308c of the leads 171. In this context, the term "substantially" indicates, in part, that the cavity 111 having the chip 102 disposed on the cavity bottom 112 is filled by the package body 108; the term also indicates that the package body 108 typically fills the cavity 111 to sufficiently minimize or reduce pockets of air and moisture, and covers the chip 102, the bonding wires 104, and the upper sloped portions 208c, 218, and 308c to provide sufficient protection from oxidation, moisture, and other environmental conditions to meet packaging application requirements. In the illustrated embodiment, the lower sloped portions 208a of the die pad 101 and the lower sloped portions 308a of the leads 171 at least partially extend outwardly from a lower surface 160 of the package body 108. Alternatively, either the lower sloped portions 208a of the die pad 101 or the lower sloped portions 308a of the leads 171 may at least partially extend outwardly from the lower surface 160 of the package body 108.

The sloping of the upper sloped portions 208c, 218, and 308c can significantly increase the area of contact, and thus the adhesion between the package body 108 and the die pad 101, and between the package body 108 and the leads 171. This can thereby enhance the mold locking of the die pad 101 and the leads 171 in the package body 108. This can also prolong the path and time for moisture diffusion into the package 100.

In the illustrated embodiment, the upper sloped portions 208c and 308c have substantially concave profiles. In this context, the term "substantially" is used to indicate that the upper sloped portions 208c and 308c are generally concave, i.e. rounded inwards toward the center of the die pad 101 and the leads 171, but that the upper sloped portions 208c and 308c may include surface non-uniformities or roughness in the form of small peaks, such as asperities, that may be rounded outwards from the center of the die pad 101 and the leads 171. For example, FIG. 3 shows that the upper sloped portion 308c of the lead 171 has an overall shape that is generally rounded inward toward the center of the lead 171. At the same time, the upper sloped portion 308c is roughly textured with numerous asperities. These asperities engage the package body 108 during molding and thereby enhance mold locking of the lead 171 in the package body 108. These asperities can be formed through precisely controlled etching or some other suitable process. Similarly, the lower sloped portions 208a and 308a may have substantially concave profiles. In this context, the term "substantially" is used to indicate that the lower sloped portions 208a and 308a are generally concave, i.e. rounded inwards toward the center of the die pad 101 and the leads 171. For example, FIG. 2 shows that the lower sloped portion 308c of the lead 171 has an overall shape that is generally rounded inward toward the center of the lead 171. Similarly, the upper sloped portions 218 may have substantially concave profiles. In this context, the term "substantially" is used to indicate that the upper sloped portions 218 are generally concave, i.e. rounded inwards toward the center of the peripheral edge region 114. For example, FIG. 2 shows that the upper sloped portion 218 of the peripheral edge region 114 has an overall shape that is generally rounded inward toward the center of the peripheral edge region 114.

It will be understood that the die pad 101 may be alternatively described. For example, in FIG. 2, the die pad 101 includes a base 202 with an upper surface 212 and a lower surface 153. A protrusion 213 with an upper surface 151 extends upwardly from the base 202 and is disposed adjacent to a peripheral edge of the base 202. A side surface 208 extends between the tipper surface 151 of the protrusion 213 and the lower surface 153 of the base 202, and includes a peak 208b. A side surface 218 extends between the upper surface 151 of the protrusion 213 and the upper surface 212 of the base 202. In the illustrated embodiment, the upper surface 212 of the base 202 includes a central region 212a on which the chip 102 is disposed. The upper surface 212 may also include a recess 212b around the central region 212a. The central region 212a may be approximately centrally located within the upper surface 212, but need not be it for example, the recess 212b is of non-uniform width. The recess 212b may completely surround the central region 212a, but also can partially surround the central region 212a for certain implementations.

It will also be understood that the package body 108 may be alternatively described. For example, in FIG. 1, FIG. 2, and FIG. 3, the package body 108 is formed over the chip 102, the die pad 101, and the leads 171 so that the package body 108 substantially covers the upper surface 212 of the base 202 and the side surface 218. The package body 108 also substantially covers at least a portion of the side surface 208 above the peak 208b, and at least a portion of the side surface 308 above the peak 308b. In this context, the term "substantially" indicates, in part, that the upper surface 212 of the base 202 having the chip 102 disposed thereon is covered by the package body 108; the term also indicates that the package body 108 typically covers the chip 102, the bonding wires 104, the upper surface 212 of the base 202, the side surface 218 the portion of the side surface 208 above the peak 208b, and the portion of the side surface 308 above the peak 308b to provide sufficient protection from oxidation, moisture, and other environmental conditions to meet packaging application requirements. At least a portion of the side surface 208 below the peak 208b protrudes from the lower surface 160 of the package body 108. Similarly, at least a portion of the side surface 308 below the peak 308b protrudes from the lower surface 160 of the package body 108.

The package 100 may further include a metal coating 116 disposed on the upper surface 151 of the peripheral edge region 114 as shown in FIG. 1, alternatively described as disposed on the upper surface 151 of the protrusion 213 as shown in FIG. 2. The package 100 may also include a metal coating 117 disposed on the lower surface 153 of the die pad 101 as shown in FIG. 1, alternatively described as disposed on the lower surface 153 of the base 202 as shown in FIG. 2. The package 100 may also include a metal coating 126 disposed on the upper surfaces 155 of the leads 171 as shown in FIG. 1, and a metal coating 127 disposed on the lower surfaces 157 of the leads 171 as shown in FIG. 1. These metal coatings can be disposed using techniques such as electrolytic plating and electroless plating. It is desirable that these metal coatings adhere well to the surfaces of the die pad 101 and the leads 171, enable effective wire bonding with bonding wires 104, and protect the lower surfaces of the die pad 101 and the leads 171 from oxidation and other environmental conditions. With these goals in mind, the metal coatings can include a layer of nickel in contact with the surfaces 151 and 153 of the die pad 101 and the surfaces 155 and 157 of the leads 171, and a layer of gold or palladium covering the layer of nickel. Alternatively, the metal coatings may include a layer of an alloy of nickel and either one of, or both, gold and palladium.

Referring to FIG. 1 along with FIG. 2 and FIG. 3, a standoff distance 148 can refer to the distance that the lower sloped portions 208a of the die pad 101 and/or the lower sloped portions 308a of the leads 171 extend outwardly from the lower surface 160 of the package body 108, and, for certain implementations, can include or otherwise account for a thickness of the metal coatings 117 and 127. Alternatively, the standoff distance 148 can refer to the distance that the portion of the side surface 208 below the peak 208b and/or the portion of the side surface 308 below the peak 308b protrude from the lower surface 160 of the package body 108. The protrusion of the die pad 101 and/or the leads 171 from the lower surface 160 of the package body 108 can enhance the solderability of the die pad 101 and the leads 171 to a PCB by exposing additional area on the die pad 101 and/or the leads 171 to which solder can attach. This can increase the reliability of surface mounting of the package 100 to the PCB. In one embodiment, the peak 208b is disposed closer to the lower surface 153 of the base 202 than to the upper surface 151 of the protrusion 213, and the peaks 308b are disposed closer to the lower surfaces 157 of the leads 171 than to the upper surfaces 155 of the leads 171.

For certain implementations, the standoff distance 148 is between about twenty and about fifty percent or between about twenty-five and about forty-five percent of a thickness 142 of the die pad 101 and/or at least one of the leads 171, although the standoff distance 148 is not constrained to this range and, for other implementations, may be between about five percent and about seventy-five percent of the thickness 142. The thickness 142 of the die pad 101 can be measured as the distance between the upper surface 151 of the peripheral edge region 114 and the lower surface 153 of the die pad 101. If metal coatings 116 and 117 are disposed on surfaces 151 and 153 of the die pad 101, as is typically the case, then the thickness 142 can be measured as the distance between the upper surface 150 of the metal coating 116 and the lower surface 152 of the metal coating 117. Similarly, for a lead 171, if metal coatings 126 and 127 are disposed on surfaces 155 and 157 of the lead 171, as is typically the case, then the thickness 142 can be measured as the distance between the upper surface 154 of the metal coating 126 and the lower surface 156 of the metal coating 127. As described herein, various distances can be measured relative to the surfaces of metal coatings 116, 117, 126, and 127. However, it will be understood that these distances can be similarly measured relative to the surfaces 151 and 153 of the die pad 101 or the surfaces 155 and 157 of the leads 171, if any or all of the metal coatings 116, 117, 126, and 127 are not present.

In one embodiment, the thickness 142 of the die pad 101 including metal coatings 116 and 117 is substantially equal to that of at least one lead 171 including metal coatings 126 and 127, and is about 0.125 millimeters. In this case, the standoff distance 148 by which the die pad 101 and the at least one lead 171 protrudes from the lower surface 160 of the package body 108 is between about 0.025 millimeters and about 0.0625 millimeters or between about 0.03 millimeters and about 0.05 millimeters. Also, the peak 208b of the side surface 208 of the die pad 101 is substantially level with the peak 308b of the side surface 308 of the at least one lead 171. In an alternative embodiment, the thickness 142 of the die pad 101 and/or the at least one lead 171 may be above or below 0.125 millimeters.

As the standoff distance 148 becomes a larger percentage of the thickness 142 within the range of about twenty to about fifty percent, the reliability of mold locking of the die pad 101 and/or the leads 171 in the package body 108 typically tends to decrease, while the reliability of surface mounting of the package 100 on a PCB typically tends to increase. At the same time, the duration and cost of bottom side etching (see FIG. 6) typically increases. The choice of the standoff distance 148 as a percentage of the thickness 142 can be a tradeoff between these factors.

A mold cap 140 can refer to the distance between an upper surface 164 of the package body 108 and the upper surface 150 of the metal coating 116. Similarly, for a lead 171, the mold cap 140 can be measured as the distance between the upper surface 164 of the package body 108 and the upper surface 154 of the metal coating 126. The mold cap 140 is typically large enough so that the chip 102 and the bonding wires 104 are enclosed within the package body 108. In one embodiment, the mold cap 140 is between about 0.4 millimeters and about 1 millimeter, such as about 0.675 millimeters, although the mold cap 140 can be smaller so long as the chip 102 and the bonding wires 104 remain sufficiently enclosed within the package body 108. The inclusion of the cavity 111 in the die pad 101 can enable the chip 102 to be disposed on the central portion 112a of the cavity bottom 112 as shown in FIG. 1. Alternatively, the chip 102 can be disposed on the central region 212a of the upper surface 212 of the base 202 as shown in FIG. 2.

In FIG. 1 and FIG. 2, distance 206 measures a depth of the central portion 112a (or central region 212a) relative to the upper surface 150 of the metal coating 116. Distance 204 measures a depth of the recess 112b (or recess 212b) relative to the upper surface 150 of the metal coating 116. For certain implementations, the distance 206 is between about fifty-five and about eighty percent of the distance 204, although the distance 206 is not constrained to this range. In one embodiment, the distance 206 is about 0.065 millimeters and the distance 204 is about 0.095 millimeters Both the distances 204 and 206 may vary above or below these values, so long as the distances 204 and 206 remain less than the thickness 142 of the die pad 101 by some margin, such as about 0.01 millimeters. Preferably, the central portion 112a (or central region 212a) and the recess 112b (or recess 212b) are the result of etching (see FIG. 5), rather than plating to build up the peripheral edge region 114 (or central protrusion 213). Plating may be both more costly and time consuming than the etching process subsequently described and shown in FIG. 5.

By disposing the chip 102 on the cavity bottom 112 (or upper surface 212 of the base 202), the top surface of the chip 102 is lower by the distance 206 relative to the upper surface 150 of the metal coating 116, and relative to the upper surfaces 154 of the metal coating 126 on each lead 171. As a result, the mold cap 140 can be reduced, which can make the package 100 thinner. In addition, the lower surface of the chip 102 is closer by distance 206 to the lower surface 152 of the metal coating 117. This can enhance heat dissipation from the chip 102 through the die pad 101.

Referring to FIG. 1 along with FIG. 2 and FIG. 3, a height difference 146 refers to the distance between a plane 166 through the highest point of the central portion 112a (or central region 212a) and the lower surface 160 of the package body 108. The lower surface 160 of the package body 108 typically corresponds, at least approximately, to the lower surface of the package body 108 within the recess 112b (or recess 212b). For certain implementations, the height difference 146 is between about 0.02 millimeters and about 0.04 millimeters, although the height difference 146 is not constrained to this range. For certain implementations, the upper surface 150 of the metal coating 116 can be disposed between about 0.05 millimeters and about 0.08 millimeters above the plane 166, but is not constrained to this range. Also, the peak 208b of the side surface 208 of the die pad 101 and the peak 308b of the side surface 308 of at least one lead 171 may be disposed below the plane 166. The height difference 146 and the positioning of the peaks 208b and 308b relative to the plane 166 can be controlled by etching, such as through a top side etching process (see FIG. 5).

Distance 144 refers to the minimum distance from side surface 162 of the package body 108 to side surfaces 308 of any of the leads 171. In the embodiment of FIG. 1, distance 144 is illustrated as the distance from the side surface 162 to the peak 308b of the leftmost outer lead 171A. For certain implementations, the distance 144 is between about 0.1 millimeters and about 0.3 millimeters, although the distance 144 is not constrained to this range. The portion of the package body 108 to the left of leftmost outer lead 171A (and similarly to the right of rightmost outer lead 171B) can prevent peeling and detachment of the outer leads 171A and 171B during singulation (see FIG. 6) and during use of the package 100.

Lead spacing 145, also referred to as terminal pitch, refers to the distance between the centers of a pair of adjacent leads 171. For certain implementations, the lead spacing 145 is between about 0.35 and about 0.55 millimeters, although the lead spacing 145 is not constrained to this range. The lead spacing 145 can be controlled by etching, such as through a top side etching process (see FIG. 5).

In FIG. 3, a protective layer 310 is shown substantially covering the lower sloped portion 308a of at least one of the plurality of leads 171. In this context, the term "substantially" indicates that the protective layer 310 typically covers the lower sloped portion 308a of the at least one lead 171 to sufficiently protect the underlying metal from oxidation, moisture, and other environmental conditions to meet packaging application requirements. The package body substantially covers the upper sloped portion 308c (or the portion of the side surface 308 above the peak 308b), but does not entirely cover the lower sloped portion 308a (or the portion of the side surface 308 below the peak 308b), or at least does not cover that part of the lower sloped portion 308a that extends outwardly from the lower surface 160 of the package body 108. As a result, the protective layer 310 is included in addition to the protective metal coating 127 (see FIG. 1) on the lower surface 157 of the lead 171 to prevent or reduce oxidation and corrosion of the underlying metal, which is typically copper or a copper alloy. A similar protective layer may be applied to the lower sloped portion 208a of the die pad 101 (or the portion of the side surface 208 below the peak 208b). In FIG. 2, a protective layer 210 is shown substantially covering the lower sloped portion 208a of the die pad 101. The protective layer 210, along with the protective metal coating 117 (see FIG. 1) on the lower surface 153 of the die pad 101, sufficiently protects the underlying metal of the die pad 101 to meet packaging application requirements.

In one embodiment, the protective layers 210 and 310 can include a metal coating. The metal coating may include at least one of a layer of tin, a layer of nickel, and a layer of gold. Alternatively, the metal coating may include a layer of an alloy of two or more of these metals. The metal coating may be attached to the lower sloped portions 208a and 308a using immersion, electrolytic plating, electroless plating, or any other suitable process.

In another embodiment, the protective layers 210 and 310 can include a solder material. The solder material may include a solder paste. The solder paste may be selectively disposed on the lower sloped portions 208a and 308a, while the protective metal coatings 117 and 127 (without the solder paste) substantially cover the lower surface 153 of the die pad 101 and the lower surface 157 of at least one lead 171. In this context, the term "substantially" indicates that the protective metal coatings 117 and 127 typically cover the lower surfaces 153 and 157 to sufficiently protect the underlying metal from oxidation, moisture, and other environmental conditions to meet packaging application requirements. The protective metal coatings 117 and 127 may also protect the underlying metal during etching, as described and illustrated in FIG. 5. Alternatively, the solder paste may be disposed on both the lower sloped portions 208a and 308a and the lower surfaces 153 and 157. The solder paste is then dried or hardened. Alternatively, the solder paste may be refowed and hardened into a solder bump.

In another embodiment, the protective layers 210 and 310 can include an organic solderability preservative (OSP) layer. The OSP layer may be attached to the lower sloped portions 208a and 308a using immersion or rinsing with a solution based on an organic material, or any other suitable process. The organic material may be an imidazole based material. The OSP layer may be selectively disposed on the lower sloped portions 208a and 308a, or alternatively may be disposed on the lower sloped portions 208a and 308a, the lower surface 153 of the die pad 101, and the lower surface 157 of at least one lead 171. If the OSP layer is disposed on the lower surfaces 153 and 157, an additional processing operation to remove the OSP layer may be omitted, as the OSP layer typically evaporates at temperatures encountered when soldering the die pad 101 and at least one lead 171 to a PCB.

The use of a solder material and/or an organic material as part of protective layers 210 and 310 is desirable for at least two reasons. First, typical solder materials and organic materials are less costly than metals such as nickel, gold, and tin. Second, solder materials and organic materials can be applied to the die pad 101 and at least one lead 171 without using electrolytic or electroless plating processes, which can simplify the creation of the protective layers 210 and 310.

Figure 4:
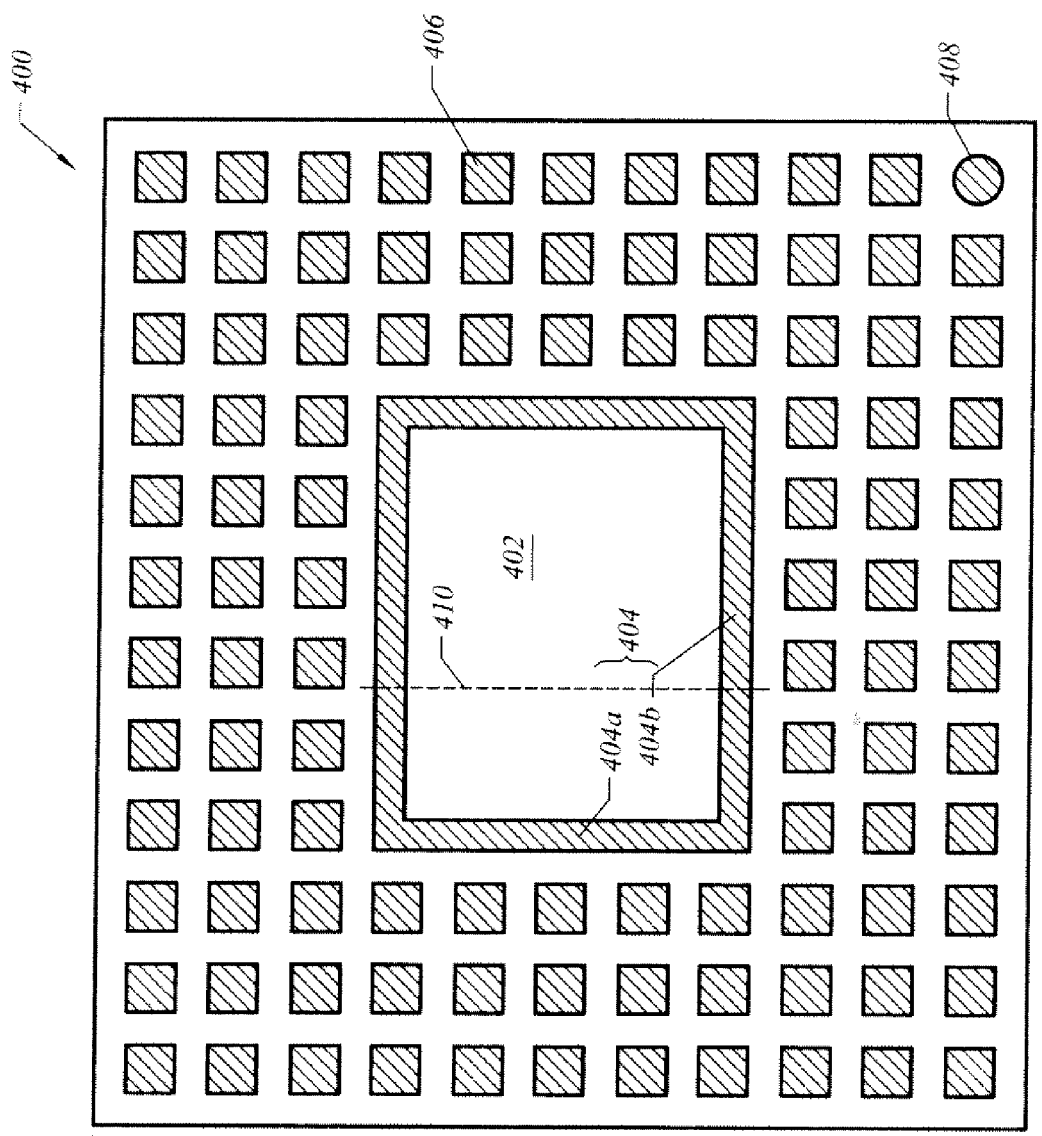
FIG. 4 illustrates a top view of a portion of a metal carrier plate, in accordance with one embodiment of the present invention.

FIG. 4 illustrates a top view of a portion of a metal carrier plate 400, in accordance with one embodiment of the present invention. The metal carrier plate 400 may be formed as described in FIG. 5. The metal carrier plate 400 includes a base 402, and the base 402 has a central protrusion 404 extending upwardly from the base 402. In this context, the term "central" indicates that the protrusion 404 may be approximately centrally located within the portion of the metal carrier plate 400 shown in FIG. 4. However, the portion of the metal carrier plate 400 shown in FIG. 4 can be variously located within the metal carrier plate 400, including bordering the edge of the metal carrier plate 400. Although the central protrusion 404 is shown as extending completely around a circumference of the base 402 in FIG. 4, the central protrusion 404 may extend partially around the base 402 in another embodiment. A plurality of peripheral protrusions 406 are disposed around the base 402. Although the peripheral protrusions 406 are shown as substantially completely surrounding the base 402 in FIG. 4, the peripheral protrusions 406 may partially surround the base 402 in another embodiment. A corner peripheral protrusion 408 at one of the corners of the portion of the metal carrier plate 400 may be of a different shape and/or size from the other peripheral protrusions 406. This corner peripheral protrusion 408 may serve as a recognition mark to facilitate the orientation, during surface mounting, of a resulting package.

Figure 5:
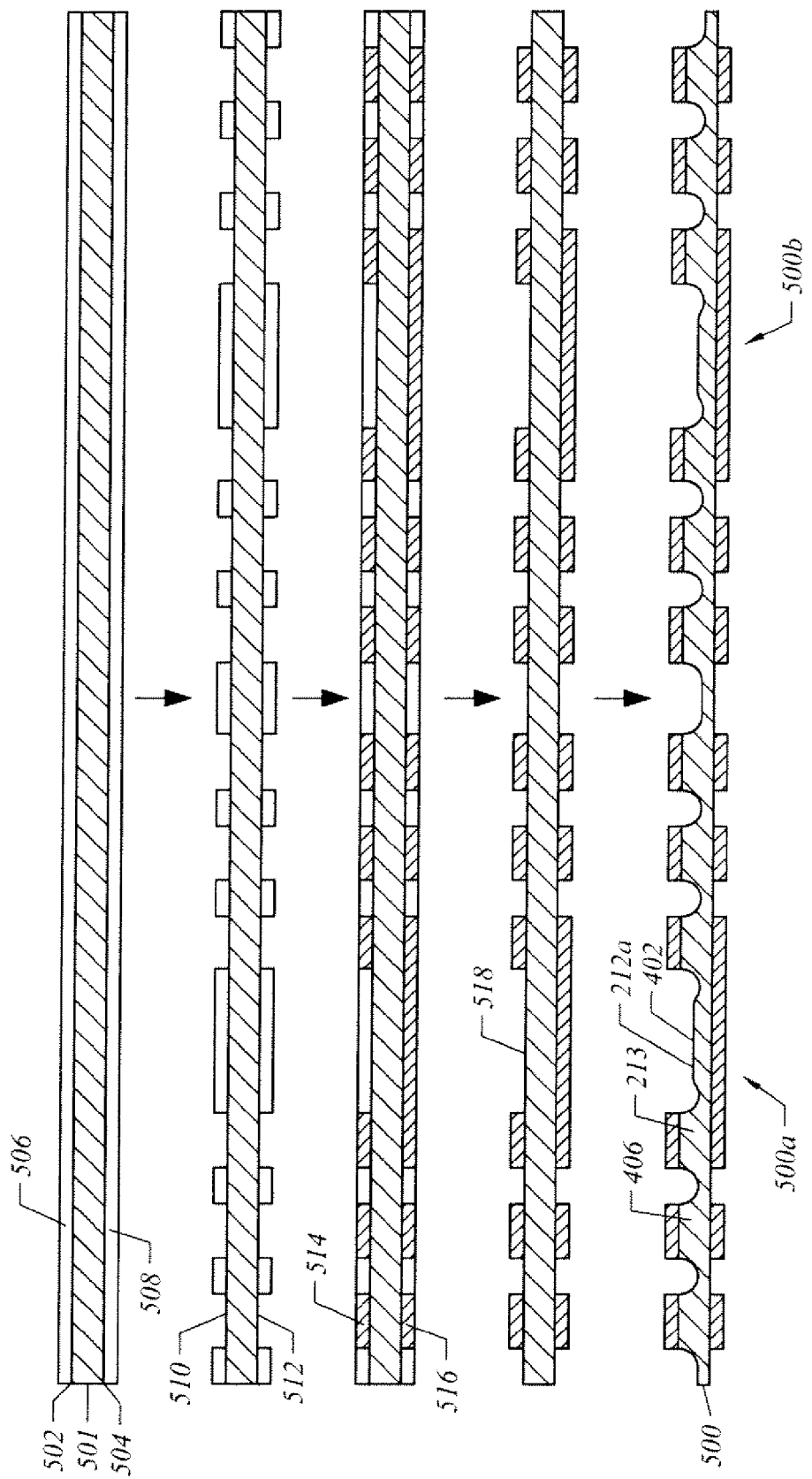
FIG. 5 illustrates processing operations for making a metal carrier plate, in accordance with one embodiment of the present invention.
Figure 6:
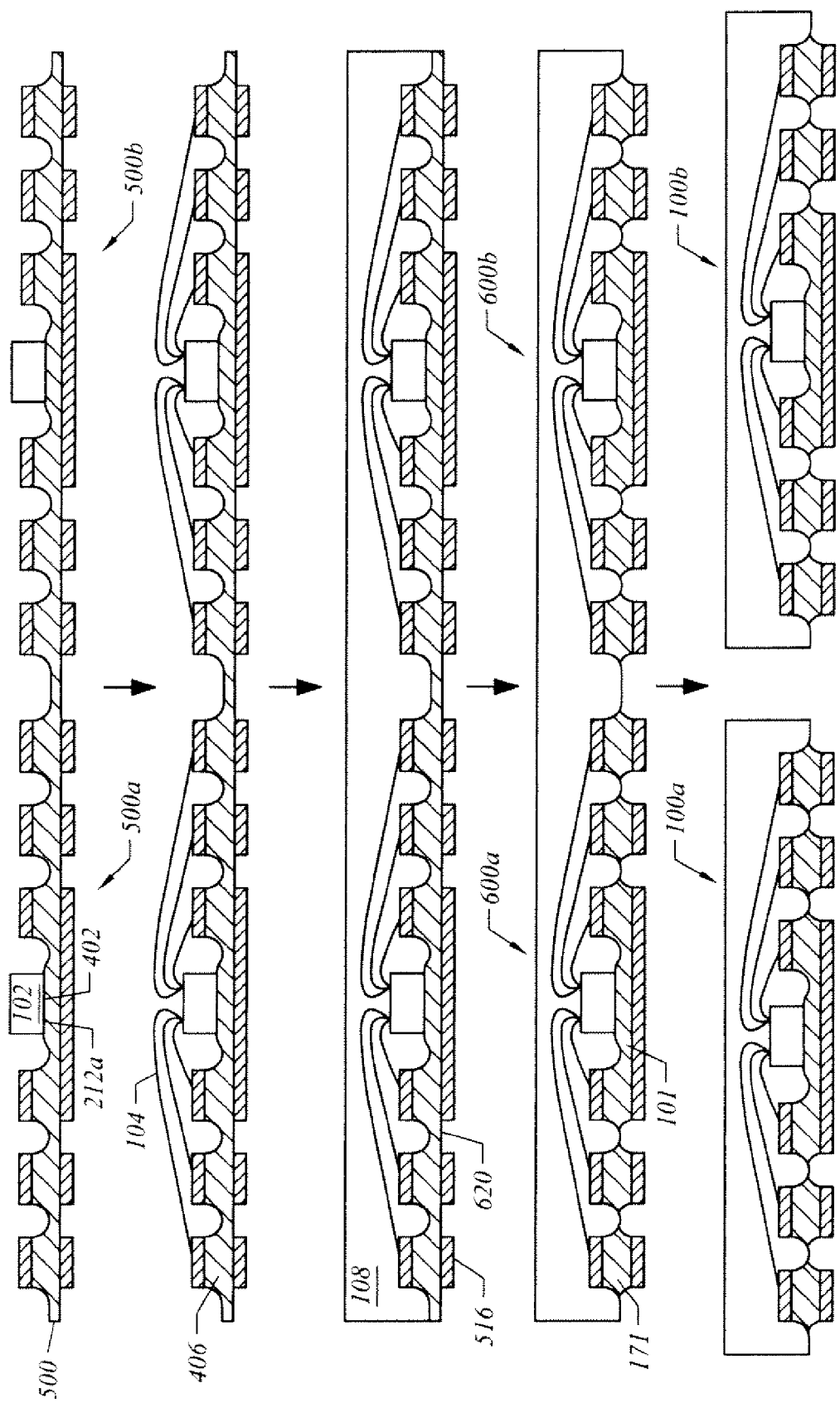
FIG. 6 illustrates processing operations for making a semiconductor package, in accordance with one embodiment of the present invention.

The hatched portions of the metal carrier plate 400 (404, 406, and 408) have not been etched, and therefore protrude from the other portions of the metal carrier plate 400 (including part of 402), which have been etched from the top side (see FIG. 5). In one embodiment, the peripheral protrusions 406 are disposed in at least three rows on at least one side of the base 402. After bottom side etching (see FIG. 6), the base 402 and the peripheral protrusions 406 are separated and formed into the die pad 101 and the leads 171, as previously described in FIGS. 1 through 3. Since the peripheral protrusions 406 need not be connected to a disposable portion of a leadframe, as is typically the case for a QFN leadframe, the creation of multiple rows of leads 171 using the processing operations of FIGS. 5 and 6 is significantly more scalable to two or more such rows than is typical QFN processing.

In one embodiment, after bottom side etching (see FIG. 6), the central protrusion 404 may include a ground segment to which a chip (e.g., the chip 102) is electrically coupled using bonding wires (e.g., the bonding wires 104). The ground segment may be a ground ring that includes the entire central protrusion 404. In another embodiment, the ground segment may be a first portion 404a of the central protrusion 404, and a power segment may be a second portion 404b of the central protrusion 404. In this case, a first portion of the base 402 connected to the ground segment 404a can be electrically isolated from a second portion of the base 402 connected to the power segment 404b. The electrical isolation may be performed using etching, singulation, or any other suitable process to physically separate the first portion of the base 402 from the second portion of the base 402, such as along the dotted line 410.

It will be understood that the portion of the metal carrier plate 400 shown in FIG. 4 may be alternatively described. For example, the metal carrier plate 400 may include a die receiving area 402 with a peripheral edge region 404. A plurality of peripheral bulges 406 may be disposed around the die receiving area 402.

FIG. 5 illustrates processing operations for making a metal carrier plate 500, in accordance with one embodiment of the present invention. A first photoresist layer 506 is formed on an upper surface 502 of a copper plate 501, and a second photoresist layer 508 is formed on a lower surface 504 of the copper plate 501. The photoresist layers 506 and 508 are formed by coating, printing, or any other suitable technique. Predetermined or selected portions of the photoresist layers 506 and 508 are photoimaged and developed so as to create first exposed portions 510 and second exposed portions 512 of the copper plate 501. The photoresist layers 506 and 508 may be photochemically defined using a photomask (not shown).

A first metal coating 514 is then formed on the exposed portions 510, and a second metal coating 516 is formed on the exposed portions 512. The metal coatings 514 and 516 can have the same characteristics as previously described for metal coatings 116, 117, 126, and 127. The photoresist layers 506 and 508 are then stripped. Areas 518 of the upper surface 502 of the copper plate 501 without the protection of the metal coating 514 are then etched to form the metal carrier plate 500, including the previously described central region 212a, central protrusion 213, and peripheral protrusions 406. Alternatively, the etching may form the previously described die receiving area 402 and peripheral bulges 406 as part of the metal carrier plate 500. This etching operation may be referred to as top side etching.

The metal carrier plate 500 typically includes multiple interconnected portions, such as portions 500a and 500b. Each portion may include the previously described central region 212a, central protrusion 213, and peripheral protrusions 406.

FIG. 6 illustrates processing operations for making the semiconductor package 100, in accordance with one embodiment of the present invention. A chip 102 is attached to a central region 212a (or die receiving area 402) of each portion of a metal carrier plate 500, such as portions 500a and 500b. Each chip 102 is attached using an adhesive layer (not shown), as previously described. Each chip 102 is then electrically coupled to peripheral protrusions 406 (or peripheral bulges 406) through bonding wires 104. A package body 108 is then formed over each chip 102 and each of the peripheral protrusions 406. The package body 108 may be composed of a synthetic resin, and may be formed through molding methods such as transfer molding. Areas 620 of the lower surface of the metal carrier plate 500 without the protection of the metal coating 516 are then etched to separate the peripheral protrusions 406 and the central protrusion 213 to form the previously described leads 171 and die pad 101. This etching operation may be referred to as bottom side etching. The leads 171 and the die pad 101 may be formed in each of multiple connected packages sharing package body 108, such as connected packages 600a and 600b. Through singulation, the connected packages 600a and 600b may be separated into packages 100a and 100b. Singulation can be carried out by, for example, sawing, which can create substantially vertical side surfaces of the packages 100a and 100b as shown in FIG. 6.

Figure 7:
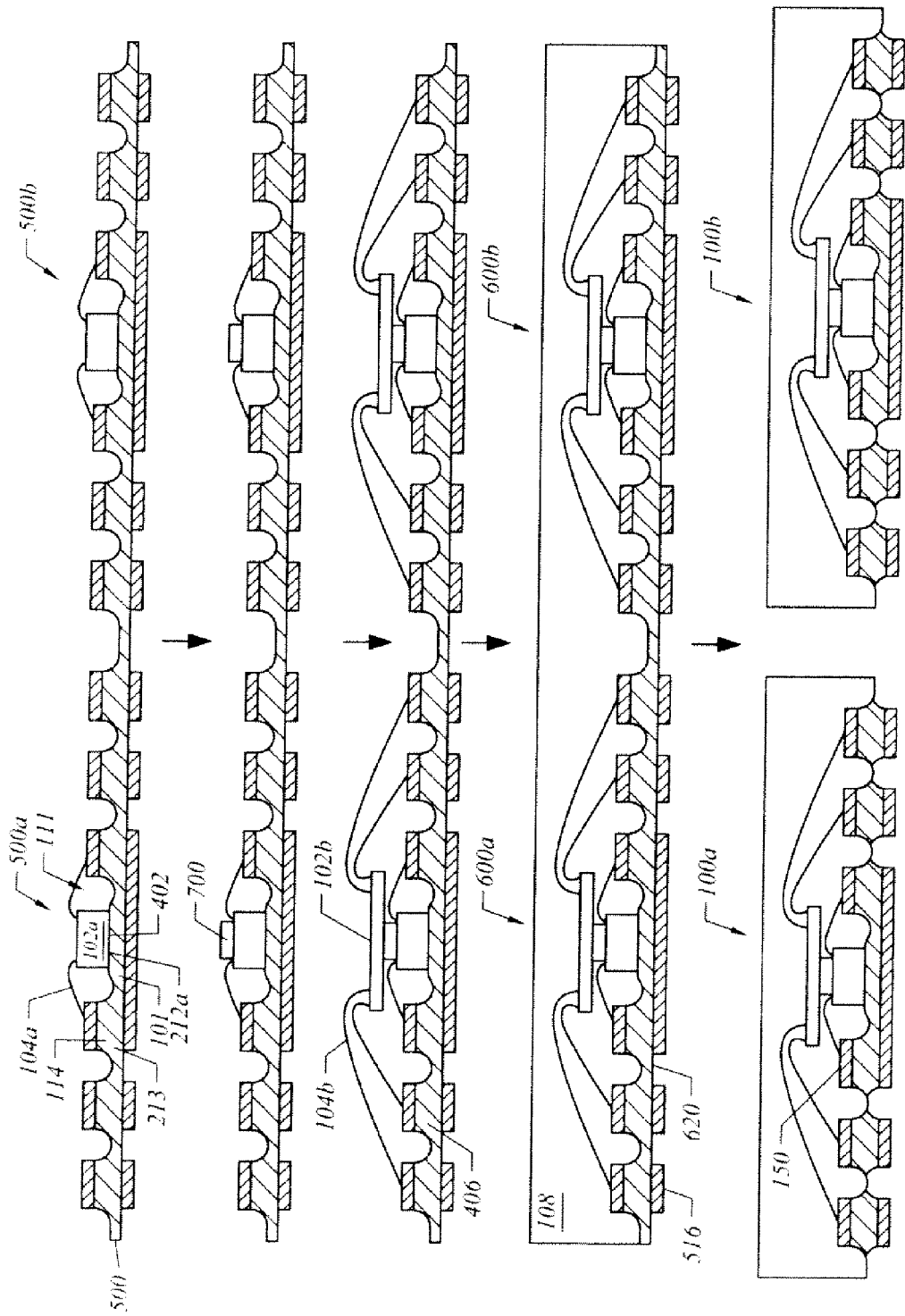
FIG. 7 illustrates processing operations for making a semiconductor package including multiple stacked dies or chips, in accordance with one embodiment of the present invention.

FIG. 7 illustrates processing operations for making a semiconductor package 100 including multiple stacked dies or chips, in accordance with one embodiment of the present invention. A first chip 102a is attached to a central region 212a (or die receiving area 402) of each portion of a metal carrier plate 500, such as portions 500a and 500b. Each first chip 102a is attached using an adhesive layer (not shown), as previously described. Each first chip 102a may then be electrically coupled to at least one portion of a central protrusion 213 (or peripheral edge region 404) through bonding wires 104a. In another embodiment, each first chip 102a may be electrically coupled to one or more peripheral protrusions 406.

An attachment layer 700 is then disposed on the upper surface of each first chip 102a. A second chip 102b is then coupled to the upper surface of each first chip 102a by the attachment layer 700. Each second chip 102b may then be electrically coupled to peripheral protrusions 406 through bonding wires 104b. In another embodiment, each second chip 102b may be electrically coupled to at least one portion of the central protrusion 213. Any peripheral protrusion 406 or portion of the central protrusion 213 to which a second chip 102b is coupled can be electrically isolated from any peripheral protrusion 406 or portion of the central protrusion 213 to which a corresponding first chip 102a is coupled.

The package body 108 is then formed over each set of stacked chips 102a and 102b and each of the peripheral protrusions 406. Areas 620 of the lower surface of the metal carrier plate 500 without the protection of the metal coating 516 are then etched to separate the peripheral protrusions 406 and the central protrusion 213 to form the previously described leads 171 and die pad 101. The leads 171 and the die pad 101 may be formed in each of multiple connected packages sharing package body 108, such as connected packages 600a and 600b. Through singulation, the connected packages 600a and 600b may be separated into packages 100a and 100b.

In one embodiment, the attachment layer 700 includes an adhesive layer. The adhesive layer may be a conductive or a non-conductive adhesive material, such as a non-conductive epoxy. The adhesive layer may be a liquid-type adhesive layer or a film-type adhesive layer, such as a double-sided tape. The adhesive layer may also be a film-on-wire adhesive layer, which has similar characteristics but is typically thicker than the film-type adhesive layer.

In one embodiment, chip 102b extends beyond the peripheral edge of chip 102a. One advantage of the film-on-wire adhesive layer is that this adhesive layer can be sufficiently thick so that when chip 102b is attached to this adhesive layer, there is still sufficient clearance for bonding wires 104a attached to chip 102a. If the film-on-wire adhesive layer is not used, then the attachment layer 700 may include a spacer in addition to the liquid-type and/or film-type adhesive layer. The purpose of the spacer is to space apart chips 102a and 102b so that there is sufficient clearance for bonding wires 104a attached to chip 102a.

As described previously, a resulting package 100 can be made thinner by disposing the chip 102 on the cavity bottom 112 (or upper surface 212 of the base 202). For a package 100 with stacked chips such as in FIG. 7, it may be especially important to take advantage of the additional space provided by the cavity 111 to make the package 100 thinner. In addition, the ordering of stacking may be important. For example, in FIG. 7, the chip 102b extends beyond the cavity 111 and partly covers over the peripheral edge region 114 of the die pad 101, so the chip 102b could not be disposed on the cavity bottom 112. However, the chip 102a is sized so that it can be disposed on the cavity bottom 112. In this case, the chip 102b may be stacked on top of the chip 102a if the height of the chip 102a plus the height of the attachment layer 700 is large enough to provide sufficient clearance above the upper surface 150 of the metal coating 116 disposed on the peripheral edge region 114, and above the bonding wires 104a.

Figure 8:
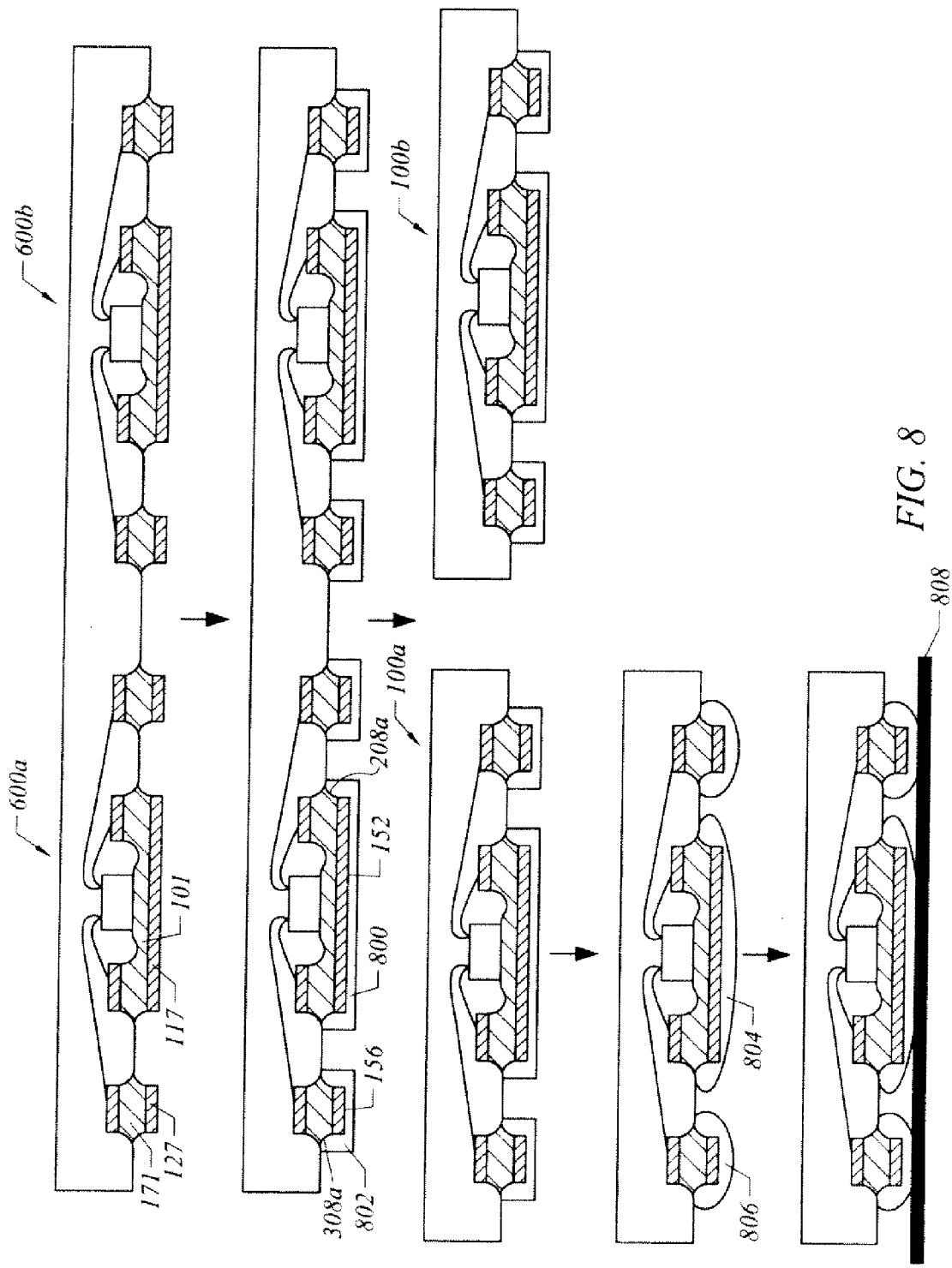
FIG. 8 illustrates processing operations for making a semiconductor package and surface mounting the semiconductor package, in accordance with one embodiment of the present invention.

FIG. 8 illustrates processing operations for making a semiconductor package 100 and surface mounting the semiconductor package 100, in accordance with one embodiment of the present invention. As described previously, leads 171 and die pad 101 may be formed in each of multiple connected packages sharing a package body 108, such as connected packages 600a and 600b. In this embodiment, a solder paste 802 is disposed to substantially cover a sloped etched area 308a of at least one lead 171, and a lower surface 156 of a metal coating 127 disposed on the lower surface 157 of that lead 171. The solder paste 802 is then solidified for defining a solder interface 802 for subsequent surface mounting. Solder paste 800 may also be disposed to substantially cover a sloped etched area 208a of the die pad 101, and a lower surface 152 of a metal coating 117 of the die pad 101. Through singulation, the connected packages 600a and 600b are then separated into packages 100a and 100b.

For surface mounting the package 100a, the solder interfaces 800 and 802 may be reflowed to form liquefied solder masses 804 and 806. The liquefied solder masses 804 and 806 are then placed into contact with a PCB 808 and hardened. The solder interfaces 800 and 802 typically contain enough solder so that, upon reflow soldering and surface mounting of the package 100a, the solder acts as a protective layer for the sloped etched areas 208a and 308a by substantially covering, these areas.

In addition to the use of the solder as a protective layer, another advantage of the surface mounting process of FIG. 8 is that surface mounting of the package 100a can be achieved by reflowing the solder interfaces 800 and 802. This removes the need for additional solder paste on the PCB 808 as part of surface mounting of the package 100a.

Figure 9:
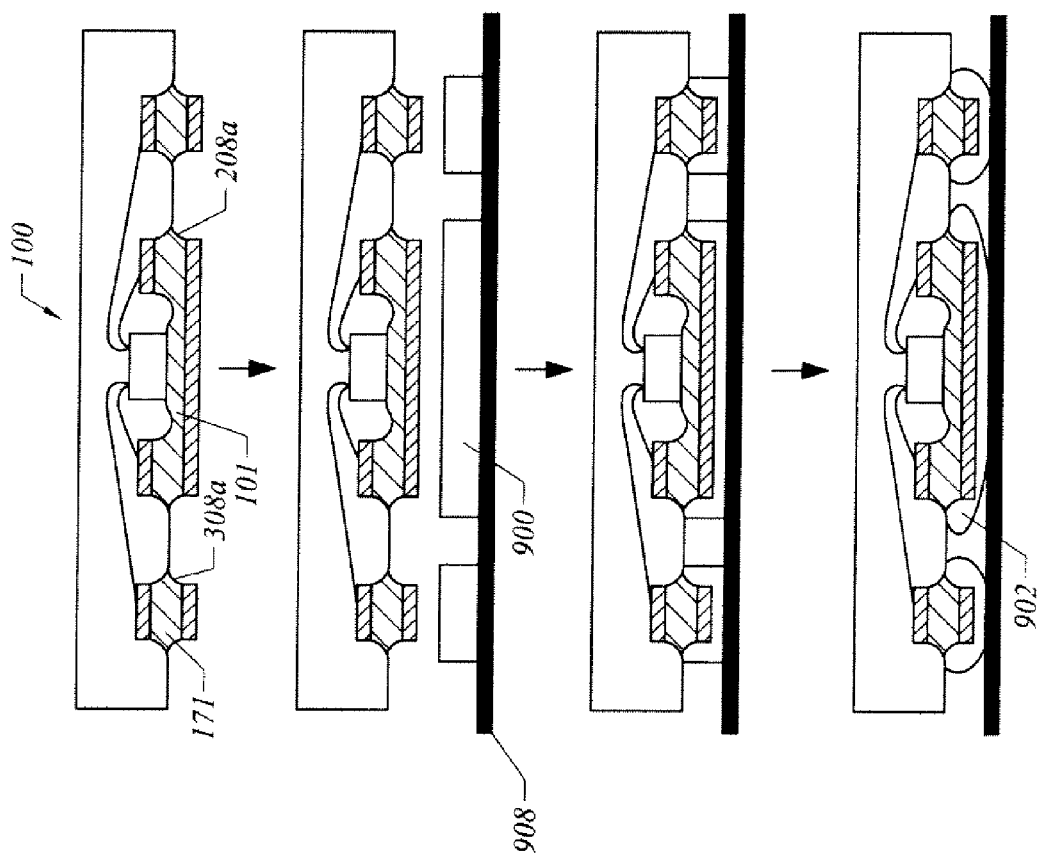
FIG. 9 illustrates processing operations for making a semiconductor package and surface mounting the semiconductor package, in accordance with another embodiment of the present invention.

FIG. 9 illustrates processing operations for making a semiconductor package 100 and surface mounting the semiconductor package 100, in accordance with another embodiment of the present invention. In this embodiment, the package 100 is provided without solder interfaces 800 and 802 for surface mounting. A sloped etched area 208a of a die pad 101 and a sloped etched area 308a of at least one lead 171 may be substantially covered with a protective layer such as an OSP layer, as described previously. Subsequently, solder paste 900 is applied on a PCB 908 in preparation for surface mounting of the package 100. After surface mounting of the package 100, the solder paste is reflowed and then hardened into solder masses 902 attaching the package 100 to the PCB 908.

As described previously, enough solder paste 900 can be applied on the PCB 908 so that upon surface mounting of the package 100 and reflow soldering, the solder acts as a protective layer for the sloped etched areas 208a and 308a by substantially covering those areas.

Figure 10:
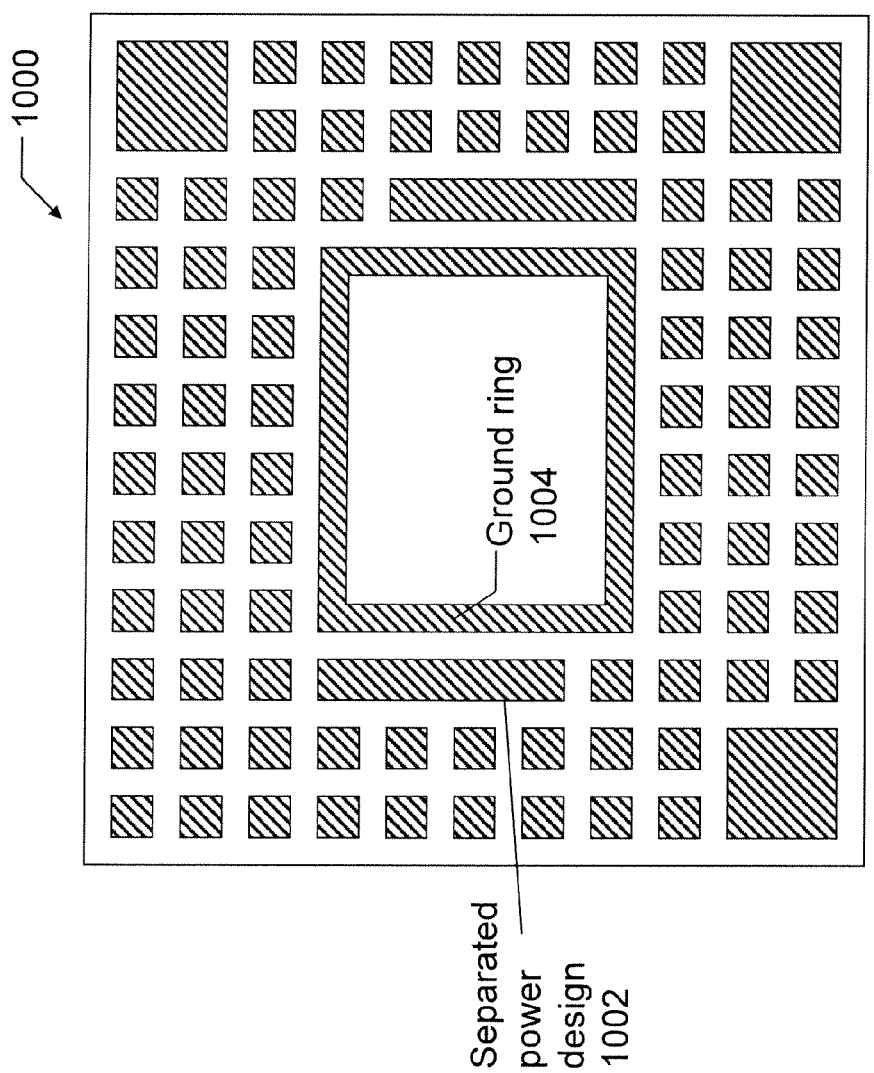
FIG. 10 illustrates a top view of a portion of a metal carrier plate including a power segment separated from a ground ring, in accordance with one embodiment of the present invention.

FIG. 10 illustrates a top view of a portion of a metal carrier plate 1000 including a power segment 1002 separated from a ground ring 1004, in accordance with one embodiment of the present invention.

While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. A semiconductor package comprising:
    a die pad including:
        a die mounting region;
        a peripheral region circumscribing a cavity with a cavity bottom, the peripheral region including a sloped exterior facing surface and a sloped interior facing surface, wherein:
            the cavity bottom includes the die mounting region and a recess contiguously circumscribing the die mounting region;
            the recess is formed at a junction of the sloped interior facing surface and the die mounting region such that the sloped interior facing surface and a surface of the recess correspond to a continuous, curved surface; and
            the sloped exterior facing surface includes an upper sloped surface, a lower sloped surface, and an apex at a junction of the upper sloped surface and the lower sloped surface;
    a plurality of leads disposed around the die pad, wherein each of the plurality of leads includes an upper sloped portion and a lower sloped portion; and
    a first semiconductor chip disposed on the die mounting region and electrically coupled to the plurality of leads; and
    a package body formed over the first semiconductor chip and the plurality of leads so that the package body substantially fills the cavity and substantially covers the upper sloped portions of the die pad and the plurality of leads, and the lower sloped portions of the die pad and the plurality of leads at least partially extend outwardly from a lower surface of the package body.

2. The semiconductor package of claim 1, wherein the continuous, curved surface is substantially parabolic.

3. The semiconductor package of claim 1, wherein the peripheral region of the die pad includes a ground segment to which the first semiconductor chip is electrically coupled.

4. The semiconductor package of claim 1, wherein a standoff distance by which at least one of the plurality of leads extends outwardly from the lower surface of the package body is substantially in the range from 0.025 millimeters to 0.0625 millimeters.

5. The semiconductor package of claim 1, wherein the die pad includes a lower surface, the peripheral region includes an upper surface, a distance between the upper surface of the peripheral region and the lower surface of the die pad corresponds to a thickness of the die pad, and a standoff distance by which the die pad extends outwardly from the lower surface of the package body is between twenty percent and fifty percent of the thickness of the die pad.

6. The semiconductor package of claim 1, further comprising:
    a first metal coating disposed on upper surfaces of the peripheral region and the plurality of leads; and
    a second metal coating disposed on lower surfaces of the die pad and the plurality of leads.

7. The semiconductor package of claim 1, wherein a distance from a side surface of the package body to a side surface of any one of the plurality of leads has a minimum value of at least 0.1 millimeters.

8. The semiconductor package of claim 1, wherein a depth of the die mounting region relative to an upper surface of the peripheral region is between fifty-five and eighty percent of a depth of the recess relative to the upper surface of the peripheral region.

9. The semiconductor package of claim 1, wherein the plurality of leads are disposed in at least three rows on at least one side of the die pad.

10. The semiconductor package of claim 1, further comprising a protective layer substantially covering the lower sloped portion of at least one of the plurality of leads.

11. The semiconductor package of claim 1, further comprising a power segment that is spaced apart from the die pad without circumscribing the die pad.

12. The semiconductor package of claim 1, wherein the continuous, curved surface is substantially concave.

13. The semiconductor package of claim 1, further comprising an attachment layer and a second semiconductor chip coupled to an upper surface of the first semiconductor chip by the attachment layer, wherein the package body is formed over the second semiconductor chip, and wherein the attachment layer includes an adhesive layer.

14. The semiconductor package of claim 1, further comprising an attachment layer and a second semiconductor chip coupled to an upper surface of the first semiconductor chip by the attachment layer, wherein the second semiconductor chip extends beyond a peripheral edge of the first semiconductor chip.

15. The semiconductor package of claim 3, wherein the peripheral region of the die pad further includes a power segment to which the first semiconductor chip is electrically coupled, wherein the power segment is physically separated from the ground segment.

16. The semiconductor package of claim 6, wherein at least one of the first metal coating and the second metal coating includes a first layer of nickel and a second layer of a metal selected from the group consisting of gold and palladium.

17. The semiconductor package of claim 14, wherein the attachment layer includes a film-on-wire adhesive layer.

18. The semiconductor package of claim 14, wherein the attachment layer includes a spacer and an adhesive layer.

19. The semiconductor package of claim 11, wherein the power segment has a length greater than a distance between two adjacent leads included in the plurality of leads.

20. A semiconductor package comprising:
a die pad including:
a die mounting region;
a peripheral region circumscribing a cavity with a cavity bottom, the peripheral region including a sloped exterior facing portion and a sloped interior facing portion, wherein:
the cavity bottom includes the die mounting region and a recess contiguously circumscribing the die mounting region;
the recess is formed at a junction of the sloped interior facing portion and the die mounting region such that a surface of the sloped interior facing portion and a surface of the recess correspond to a continuous, curved surface; and
the sloped exterior facing portion includes an upper sloped portion, a lower sloped portion, and an apex at a junction of the upper sloped portion and the lower sloped portion;
a plurality of leads disposed around the die pad, wherein each of the plurality of leads includes an upper sloped portion and a lower sloped portion; and
a package body formed over the plurality of leads so that the package body substantially fills the cavity and substantially covers the upper sloped portions of the die pad and the plurality of leads, and the lower sloped portions of the die pad and the plurality of leads at least partially extend outwardly from a lower surface of the package body;
wherein a distance from a side surface of the package body to a side surface of any one of the plurality of leads has a minimum value substantially in the range from 0.1 millimeters to 0.3 millimeters.

21. A semiconductor package comprising:
a die pad including:
a base including a lower surface that is a planar surface;
a protrusion extending upwardly from the base, wherein the protrusion includes an upper surface;
a first side surface extending between the upper surface of the protrusion and the lower surface of the base, wherein the first side surface includes a first peak located closer to the lower surface of the base than to the upper surface of the protrusion; and
a curved recess formed at a junction of the base and the protrusion;
a plurality of leads disposed around the die pad, at least one of the plurality of leads including a second side surface including a second peak;
a first semiconductor chip disposed on the upper surface of the base and electrically coupled to the plurality of leads, wherein an upper surface of the first semiconductor chip is above the upper surface of the protrusion; and
a package body formed over the first semiconductor chip and the plurality of leads so that the package body substantially covers at least a portion of the first side surface above the first peak and at least a portion of the second side surface above the second peak, and so that at least a portion of the first side surface below the first peak and at least a portion of the second side surface below the second peak protrude from a lower surface of the package body.

22. The semiconductor package of claim 21, wherein a standoff distance by which at least one of the plurality of leads extends outwardly from the lower surface of the package body is between twenty percent and fifty percent of a thickness of the at least one of the plurality of leads.

23. The semiconductor package of claim 21, wherein a standoff distance by which the die pad extends outwardly from the lower surface of the package body is substantially in the range from 0.025 millimeters to 0.0625 millimeters.

24. The semiconductor package of claim 21, wherein an upper surface of the base includes:
a central region on which the first semiconductor chip is disposed; and
a recess around the central region.

25. The semiconductor package of claim 21, further comprising an attachment layer and a second semiconductor chip coupled to an upper surface of the first semiconductor chip by the attachment layer, wherein the second semiconductor chip extends beyond a peripheral edge of the first semiconductor chip.

26. The semiconductor package of claim 21, wherein the first peak is substantially level with the second peak.

27. The semiconductor package of claim 21, wherein a thickness of the protrusion is greater than a thickness of the base.

28. The semiconductor package of claim 21, further comprising a protective layer substantially covering the first side surface below the first peak of at least one of the plurality of leads.

29. The semiconductor package of claim 21, further comprising a power segment that is electrically isolated from the die pad, the power segment disposed between the die pad and one or more of the plurality of leads.

30. The semiconductor package of claim 24, wherein the central region defines a plane, and wherein the first peak is disposed below the plane.

31. The semiconductor package of claim 30, wherein the upper surface of the protrusion is disposed substantially in the range from 0.05 to 0.08 millimeters above the plane.

32. A semiconductor package, comprising:
- a die pad comprising:
  - a lower surface that is a planar surface and that extends to a peripheral edge of the die pad;
  - a die mounting region;
  - a peripheral region circumscribing the die mounting region such that a thickness of the peripheral region is greater than a thickness of the die mounting region, wherein the peripheral region further comprises a curved inner surface facing toward the die mounting region; and
  - a curved recess formed between the curved inner surface and the die mounting region and extending below an upper surface of the die mounting region.

33. The semiconductor package of claim 32, wherein the peripheral region further comprises:
- an upper region which is substantially horizontal, the upper region being dimensioned to permit wirebonding.

34. The semiconductor package of claim 32, wherein the peripheral region further comprises:
- an outer surface, the outer surface comprising:
  - an upper region having a concave profile;
  - a lower region adjacent to the upper region and having a concave profile; and
  - a peak formed at a junction of the upper region and the lower region.

35. The semiconductor package of claim 34, further comprising:
- a package body, wherein the package body physically contacts the upper region, but does not physically contact the lower region.

36. The semiconductor package of claim 34, further comprising:
- a package body, wherein the package body covers the upper region, and wherein the lower region extends outwardly from a lower surface of the package body.

37. The semiconductor package of claim 33, wherein the upper region further comprises a plating layer.

* * * * *